(12) United States Patent
Kanakubo

(10) Patent No.: US 7,253,027 B2
(45) Date of Patent: Aug. 7, 2007

(54) METHOD OF MANUFACTURING HYBRID INTEGRATED CIRCUIT DEVICE

(75) Inventor: Masaru Kanakubo, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 289 days.

(21) Appl. No.: 10/905,238

(22) Filed: Dec. 22, 2004

(65) Prior Publication Data
US 2005/0176175 A1    Aug. 11, 2005

(30) Foreign Application Priority Data
Dec. 24, 2003   (JP)   ............................. 2003-428412

(51) Int. Cl.
*H01L 21/50* (2006.01)
*H01L 21/48* (2006.01)
*H01L 29/06* (2006.01)
*H01L 23/544* (2006.01)
*H01L 21/768* (2006.01)
*H01L 21/78* (2006.01)

(52) U.S. Cl. .................. 438/113; 438/115; 257/618; 257/620; 257/E21.596; 257/E21.599

(58) Field of Classification Search .............. 438/107, 438/110, 113, 115; 257/618, 620, E21.596, 257/E21.599
See application file for complete search history.

(56) References Cited

U.S. PATENT DOCUMENTS 5,621,243 A * 4/1997 Baba et al. ................. 257/712
6,291,880 B1 * 9/2001 Ogawa et al. .............. 257/723
6,482,730 B1 * 11/2002 Masumoto et al. ......... 438/617
6,596,561 B2 * 7/2003 Takahashi et al. .......... 438/113
6,841,414 B1 * 1/2005 Hu et al. .................... 438/106
6,975,022 B2 * 12/2005 Sakamoto et al. .......... 257/676

FOREIGN PATENT DOCUMENTS

JP        6-177295      6/1994
TW        A-00418776    1/2001

OTHER PUBLICATIONS

Taiwanese Office Action dated Jul. 20, 2006.

* cited by examiner

*Primary Examiner*—Luan Thai
(74) *Attorney, Agent, or Firm*—Stephen B. Parker; Watchstone P+D, plc

(57) ABSTRACT

A method of manufacturing a hybrid integrated circuit device includes the steps of forming a plurality of units each including a conductive pattern on a surface of a board made of metal, forming grooves along boundaries of the respective units of the board, electrically connecting circuit elements to the conductive patterns in the respective units, separating the respective circuit boards by dividing the board along the grooves, and flattening side surfaces of the circuit boards by pressing the side surfaces.

6 Claims, 15 Drawing Sheets

METHOD OF MANUFACTURING HYBRID INTEGRATED CIRCUIT DEVICE

CROSS-REFERENCE TO RELATED APPLICATIONS

Priority is claimed to Japanese Patent Application Number JP2003-428412 filed on Dec. 24, 2003, the disclosure of which is incorporated herein by reference in its entirety.

FIELD OF THE INVENTION

The present invention relates to a method of manufacturing a hybrid integrated circuit device, and more specifically to a method of manufacturing a hybrid integrated circuit device including a step of dividing a board after incorporating a plurality of electric circuits on a surface thereof.

DESCRIPTION OF THE RELATED ART

A configuration of a conventional hybrid integrated circuit device will be described with reference to FIG. 12A and FIG. 12B (see Patent Document 1, for example). FIG. 12A is a perspective view of a hybrid integrated circuit device 100, and FIG. 12B is a cross-sectional view taken along the X-X' line in FIG. 12A.

The conventional hybrid integrated circuit device 100 has the following configuration. The hybrid integrated circuit device 100 includes a rectangular board 106, a conductive pattern 108 formed on an insulating layer 107 provided on a surface of the board 106, circuit elements 104 fixed onto the conductive pattern 108, metallic wires 105 for electrically connecting the circuit elements 104 to the conductive pattern 108, and leads 101 electrically connected to the conductive pattern 108. All the above-described constituents of the hybrid integrated circuit device 100 are sealed with sealing resin 102. The sealing method using the sealing resin 102 includes injection molding applying thermoplastic resin and transfer molding applying thermosetting resin.

Next, a method of manufacturing the above-mentioned conventional hybrid integrated circuit device 100 will be described with reference to FIG. 13A to FIG. 15.

A process for dividing a large-sized metal board 116A into rectangles will be described with reference to FIGS. 13A and 13B. FIG. 13A is a plan view of the large-sized metal board 116A. FIG. 13B is a cross-sectional view of the large-sized metal board 116A.

A method of dividing the large-sized metal board 116A into the rectangles will be described with reference to FIG. 13A. Here, the large-sized metal board 116A is divided into the rectangles along dicing lines D10. Such division is achieved by shearing attributable to shearing force. Moreover, the metal board divided into the rectangles may be divided into two or more pieces while considering workability in subsequent processes such as a bonding step.

A configuration of the metal board 116A will be described with reference to FIG. 13B. Here, the metal board 116A is a board made of aluminum, and both surfaces thereof are subjected to an alumite treatment. Moreover, the insulating layer 107 is provided on the surface on which hybrid integrated circuits are to be formed in order to insulate the metal board 116A from the conductive patterns. In addition, copper foil 118 for constituting the conductive pattern is attached by pressure onto the insulating layer 107.

A process for forming hybrid integrated circuits 117 on a surface of a metal board 116B divided into a rectangle will be described with reference to FIGS. 14A and 14B. FIG. 14A is a plan view of the rectangular metal board 116B on which a plurality of hybrid integrated circuits 117 are formed. Meanwhile, FIG. 14B is a cross-sectional view of FIG. 14A.

Firstly, the conductive patterns 108 are formed by etching the copper foil, which is attached by pressure onto the insulating layer 107. Here, the conductive patterns 108 are patterned so as to form the plurality of hybrid integrated circuits on the rectangular metal board 116B.

Next, the circuit elements 104 are fixed at given positions on the conductive patterns 108 by use of a brazing material such as solder. It is possible to adopt passive elements and active elements generally as the circuit elements 14. Meanwhile, when mounting elements for a power system, such elements may be mounted on heat sinks which are fixed onto the conductive patterns.

A method of dividing the metal board 116B, on which the plurality of hybrid integrated circuits 117 are formed, into respective circuit boards 106 will be described with reference to FIG. 15. The respective circuit boards 106, which include the hybrid integrated circuits 117 that are formed on the surface, are divided from the metal board 116B by stamping the portions corresponding to the circuit boards 106 by use of a press machine. Here, the press machine stamps the metal board 116B out from the surface where the hybrid integrated circuits 117 are formed. Therefore, peripheral end portions of the circuit board 106 constitute margins where any conductive patterns or any circuit elements are not formed.

The circuit boards 106 which have been divided into respective pieces in the above-described process are further subjected to a process for sealing the hybrid integrated circuits 117 and the like, and are finished as products.

(Patent Document 1) Japanese Unexamined Patent Publication No. 6(1994)-177296 (p. 4, FIG. 1)

However, the above-described method of manufacturing a hybrid integrated circuit device has the following problems. Specifically, outer dimensions of the boards 106 formed by stamping may vary and it is therefore difficult to achieve accurate alignment based on the contour of the board 106 in the processes after the stamping process. Moreover, burr is formed at peripheral portions of the respective boards 106 divided by stamping, and the burr may fall off onto the boards and may cause short circuits in the hybrid integrated circuits.

SUMMARY OF THE INVENTION

The present invention has been made in consideration of the foregoing problems. The present invention provides a method of manufacturing a hybrid integrated circuit device capable of accurately forming outer dimensions of a circuit board including an electric circuit formed on a surface thereof.

A method of manufacturing a hybrid integrated circuit device of the present invention includes the steps of forming a plurality of units each including a conductive pattern on a surface of a board, electrically connecting circuit elements to the conductive patterns in the respective units, separating the respective circuit boards by dividing the board at boundaries of the units, and flattening side surfaces of the circuit boards by pressing the side surfaces.

Moreover, another method of manufacturing a hybrid integrated circuit device of the present invention includes the steps of forming a plurality of units each including a conductive pattern on a surface of a board made of metal, forming grooves at boundaries of the respective units of the board, electrically connecting circuit elements to the conductive patterns in the respective units, separating the respective circuit boards by dividing the board along the grooves, and flattening side surfaces of the circuit boards by pressing the side surfaces.

Furthermore, another method of manufacturing a hybrid integrated circuit device of the present invention includes the steps of forming a plurality of units each including a conductive pattern on a surface of a board made of metal, forming grooves at boundaries of the respective units of the board, electrically connecting circuit elements to the conductive patterns in the respective units, and separating the respective circuit boards by bending the board along the grooves.

According to the methods of manufacturing a hybrid integrated circuit device of the present invention, it is possible to flatten the side surfaces of the respective circuit boards, and thereby to equalize the outer dimensions of the circuit boards. Therefore, it is possible to perform accurate alignment by using the contour of the circuit board in the subsequent processes after separating the circuit boards.

Moreover, even when the burr is generated on the side surfaces of the circuit board in the separating step, it is possible to integrate the burr with the side surfaces of the circuit board by pressing the side surfaces of the circuit board being the metal board. Therefore, it is possible to suppress occurrence of troubles such as a short circuit attributable to the burr.

Furthermore, in the present invention, the grooves are provided at the boundaries between the units formed on the surface of the metal board, and the circuit boards in the respective units are separated by bending the metal board in the positions where these grooves are provided. Therefore, the respective circuit boards are separated in the positions where the grooves are provided, and it is possible to obtain the circuit board having the accurate outside dimensions.

DETAILED DESCRIPTION OF THE PREFERRED EMBODIMENT

Figure 1A:
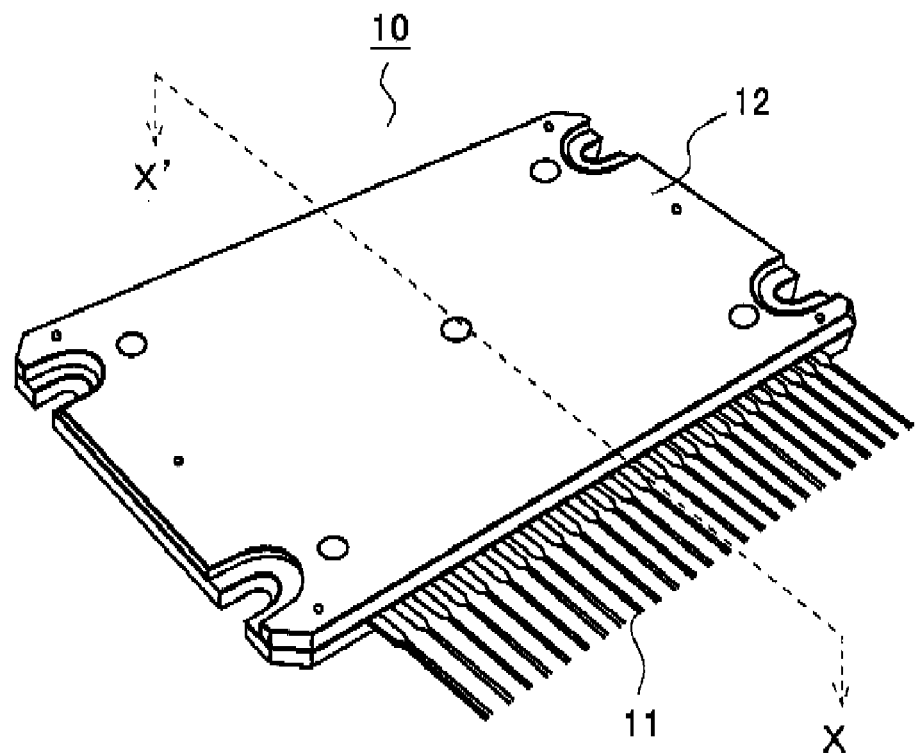
FIG. 1A is a perspective view and FIG. 1B is a cross-sectional view showing a hybrid integrated circuit device of the preferred embodiment.
Figure 1B:
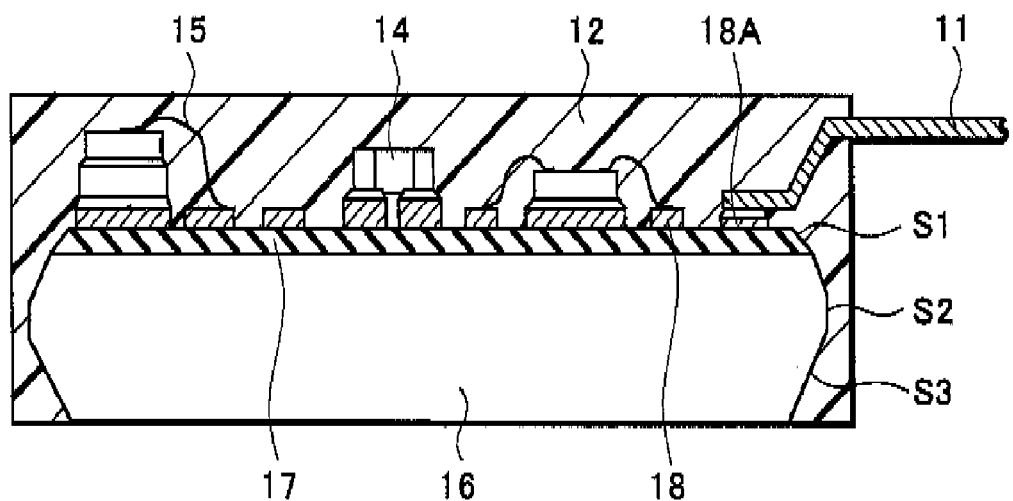

A configuration of a hybrid integrated circuit device 10 according to a preferred embodiment of the present invention will be described with reference to FIGS. 1A and 1B. FIG. 1A is a perspective view of the hybrid integrated circuit device 10, and FIG. 1B is a cross-sectional view taken along the X-X' line in FIG. 1A.

The hybrid integrated circuit device 10 of the preferred embodiment includes a circuit board 16 having an electric circuit composed of a conductive pattern 18 and circuit elements 14 formed on a surface thereof, and sealing resin 12 for sealing the electric circuit and covering at least the surface of the circuit board 16. The respective constituents will now be described below.

The circuit board 16 is a board made of metal such as aluminum or copper. For example, when a board made of aluminum is adopted as the circuit board 16, there are two methods of insulating the circuit board 16 from the conductive pattern 18 formed on the surface thereof. The first method is to subject the surface of the aluminum board to an alumite treatment. The second method is to form an insulating layer 17 on the surface of the aluminum board and then to form the conductive pattern 18 on a surface of the insulating film 17. Here, in order to release heat generated by the circuit elements 14 placed on the surface of the circuit board 16 effectively to outside, a back surface of the circuit board 16 is exposed from the sealing resin 12 to outside. Alternatively, it is also possible to seal the entire device including the back surface of the circuit board 16 by use of the sealing resin 12 to improve moisture resistance of the entire device.

In addition, a side surface of the circuit board 16 is formed into a shape having inclined portions that protrude outward.

To be more precise, the side surface includes a first inclined portion S1 provided continuously from the surface of the circuit board 16, and a second inclined portion S3 provided continuously from the back surface of the circuit board 16. Moreover, the first inclined portion S1 and the second inclined portion S3 may be joined continuously through a vertical portion S2. By providing the side surface of the circuit board 16 with the inclined portions as described above, it is possible to improve adhesion strength between the side surface of the circuit board 16 and the sealing resin 12.

The circuit elements 14 are fixed onto the conductive pattern 18, whereby the circuit elements 14 and the conductive pattern 18 collectively constitute a given electric circuit. Active elements such as transistors or diodes, and passive elements such as capacitors or resistors are adopted as the circuit elements 14. Meanwhile, an element causing a large amount of heat generation such as a semiconductor element for a power system may be fixed to the circuit board 16 through a heat sink made of metal. Here, active elements and the like mounted face up thereon are electrically connected to the conductive pattern 18 through thin metallic wires 15.

The conductive pattern 18 is made of metal such as copper, and is formed so as to be insulated from the circuit board 16. Moreover, pads 18A made of the conductive pattern 18 are formed on an edge where leads 11 are drawn out. Here, a plurality of pads 18A are aligned in the vicinity of an edge of the circuit board 16. In addition, the conductive pattern 18 is adhered to the surface of the circuit board 16 through the insulating layer 17 functioning as an adhesive.

The leads 11 are fixed to the pads 18A provided at a peripheral portion of the circuit board 16, and have a function to perform input and output to and from outside, for example. Here, multiple leads 11 are provided along an edge. Adhesion between the leads 11 and the pads 18A is achieved by use of a conductive adhesive such as solder (a brazing material). Alternatively, it is possible to provide the pads 18A on an opposite edge of the circuit board 16 and to fix the leads 11 to these pads.

The sealing resin 12 is formed by transfer molding using thermosetting resin or by injection molding using thermoplastic resin. Here, the sealing resin 12 is formed so as to seal the circuit board 16 and the electric circuit formed on the surface thereof, while the back surface of the circuit board 16 is exposed out of the sealing rein 12. It is also possible to form the sealing resin so as to real the circuit board 16 including back surface thereof.

A method of manufacturing the hybrid integrated circuit device will be described with reference to FIG. 2A to FIG. 11. The method of manufacturing the hybrid integrated circuit device of the preferred embodiment includes the steps of forming a plurality of units 32 each including a conductive pattern 18 on a surface of a metal board 19B made of metal, forming grooves 20 at boundaries of the respective units 32 of the metal board 19B, electrically connecting circuit elements 14 to the conductive patterns 18 in the respective units 32, separating the respective circuit boards 16 by dividing the metal board 19B along the grooves 20, and flattening the side surfaces of circuit boards 18 by pressing the side surfaces. The respective steps mentioned above will be described below in detail.

Figure 2A:
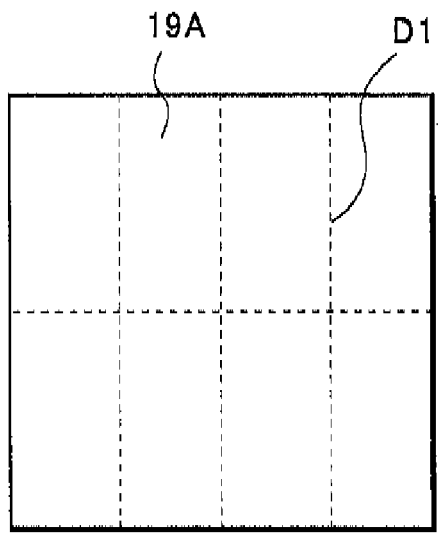
FIG. 2A is a plan view.
Figure 2B:
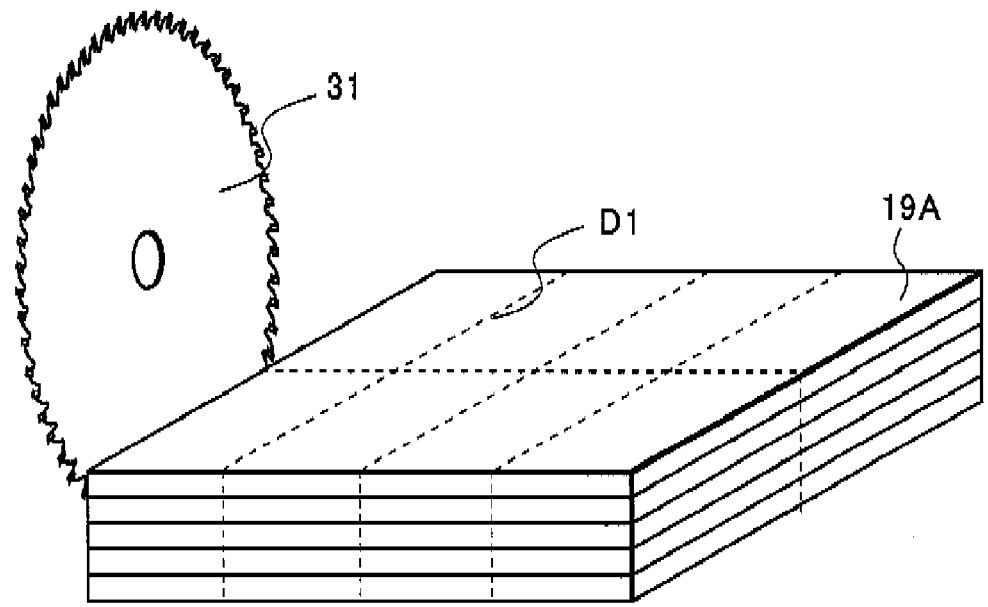
FIG. 2B is a perspective view.
Figure 2C:
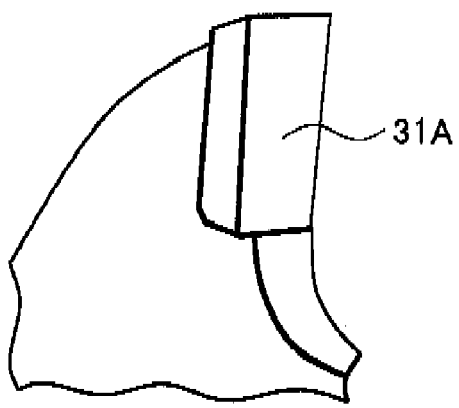
FIG. 2C is an enlarged view showing a method of manufacturing a hybrid integrated circuit device of the preferred embodiment.

First Process: see FIGS. 2A to 2C

This is a process for forming the medium-sized metal boards 19B by dividing a large-sized metal board 19A.

Firstly, as shown in FIG. 2A, the large-sized metal board 19A is prepared. For example, the large-sized metal board 19A has the dimension of approximately one meter square. Here, the metal board 19A is an aluminum plate with both surfaces subjected to an alumite treatment. Further, an insulating layer is provided on a surface of the metal board 19A. Moreover, copper foil for forming the conductive pattern is formed on a surface of the insulating layer.

Next, as shown in FIG. 2B, the metal board 19A is divided along dicing lines D1 by use of a cutting saw 31. Here, multiple sheets of stacked metal boards 19A are divided at the same time. The cutting saw 31 divides the metal boards 19A along the dicing lines D1 while rotating at high speed. As the dividing method, the large-sized metal board 19A having the square shape is herein divided into eight pieces along the dicing lines D1, thereby forming the medium-sized metal boards 19B of a rectangular shape.

The shape and other features of a blade of the cutting saw 31 will be described with reference to FIG. 2C. FIG. 2C is an enlarged view showing the vicinity of a blade 31A of the cutting saw 31. An end portion of the blade 31A is formed into a flat shape, and diamond is buried therein. By rotating the cutting saw provided with the above-described blade at high speed, it is possible to divide the metal board 19A along the dicing lines D1.

The medium-sized metal board 19B manufactured in this step is subjected to etching to remove the copper foil partially, thereby forming the conductive patterns 18. The number of the conductive patterns 18 formed herein varies depending on the size of the metal board 19B and the size of hybrid integrated circuits. However, it is possible to form the conductive patterns sufficient for forming several tens or several hundreds of the hybrid integrated circuits on each metal board 19B.

Moreover, the units composed of the conductive patterns 18 are formed in a matrix on the single metal board 19A in this case. Here, the unit means a unit for constituting one hybrid integrated circuit device.

Here, it is also possible to divide the metal plate 19A by stamping. To be more precise, it is possible to form the metal boards 19B each having the size corresponding to several pieces (2 to 8 pieces, for example) of the circuit boards by means of stamping.

Second Process: see FIGS. 3A to 4B

Figure 3A:
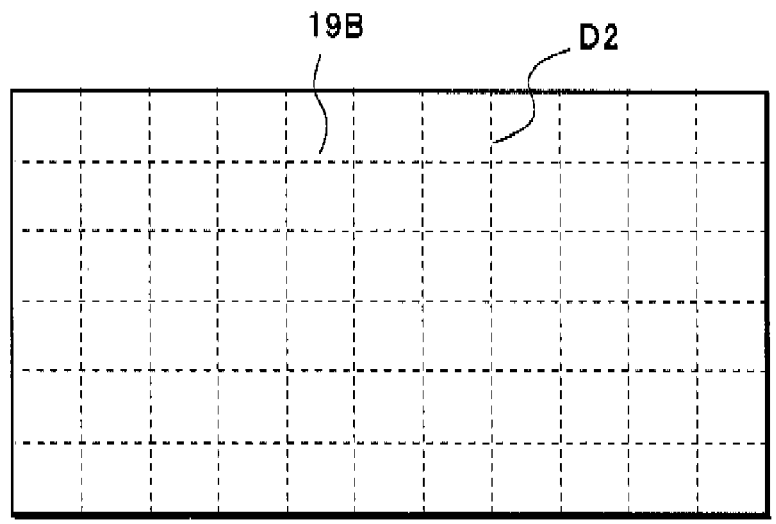
FIG. 3A is another plan view.
Figure 3B:
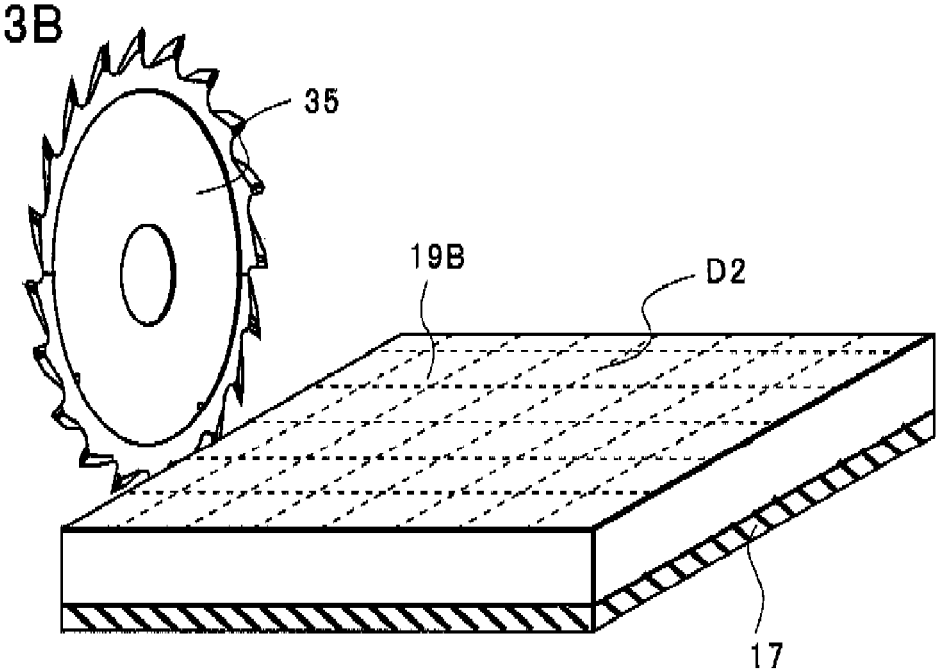
FIG. 3B is another perspective view.
Figure 3C:
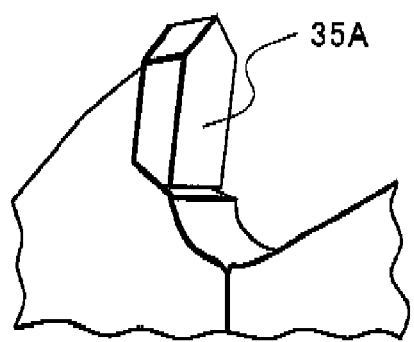
FIG. 3C is another enlarged view showing the method of manufacturing a hybrid integrated circuit device of the preferred embodiment.

This is a process for forming first grooves 20A and second grooves 20B in lattice shapes onto the front surface and the back surface of the medium-sized metal board 19B. FIG. 3A is a plan view showing the medium-sized metal board 19B divided in the earlier process. FIG. 3B is a perspective view showing a state of forming the grooves on the metal board 19B by use of a V cutting saw 35. FIG. 3C is an enlarged view of a blade 35A.

As shown in FIG. 3A and FIG. 3B, the first grooves 20A and the second grooves 20B are formed on the surface and the back surface of the metal board along dicing lines D2 while rotating the V cutting saw 35 at high speed. The dicing lines D2 are provided in a lattice shape. Moreover, the dicing lines D2 correspond to boundaries of the respective units 32 formed on an insulating layer 17.

The shape of the V cutting saw 35 will be described with reference to FIG. 3C. The V cutting saw 35 includes multiple blades 35A having the shape as shown in the drawing. Here, the shape of the blade 35A corresponds to the shape of the grooves to be formed on the metal board 19B. Here, the grooves each having a cross-section of a V shape are formed on the both surfaces of the metal board. Accordingly, the shape of each blade 35A is formed into a V shape as well. Here, diamond is buried in each blade 35A.

Figure 4A:
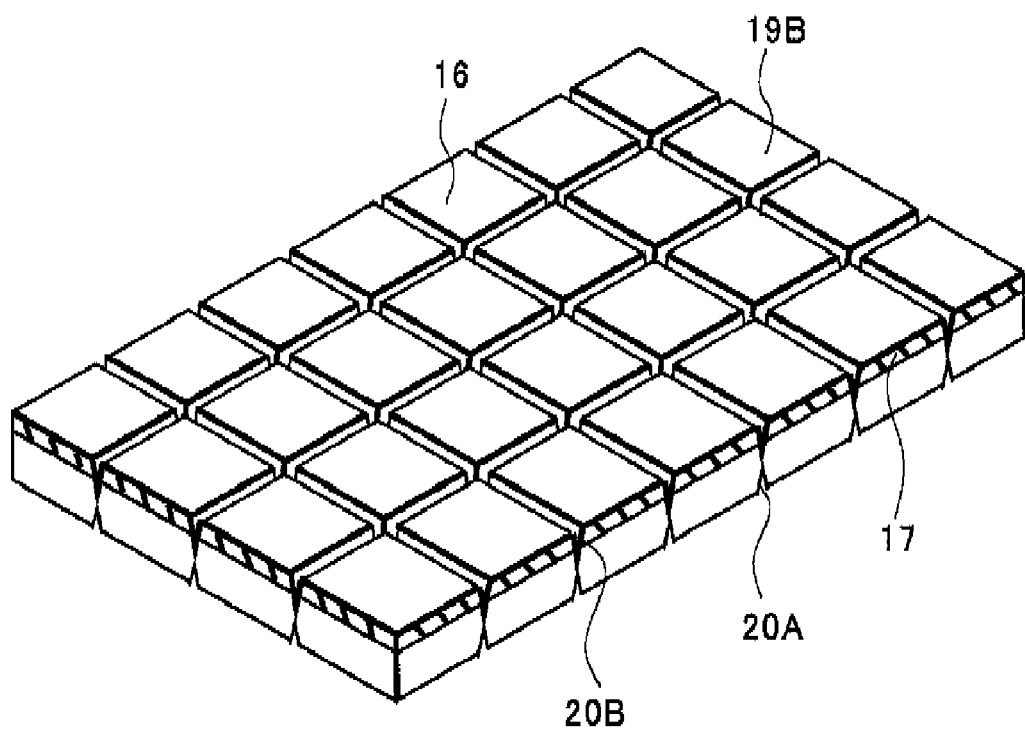
FIG. 4A is another perspective view and FIG. 4B is another cross-sectional view showing the method of manufacturing a hybrid integrated circuit device of the preferred embodiment.
Figure 4B:
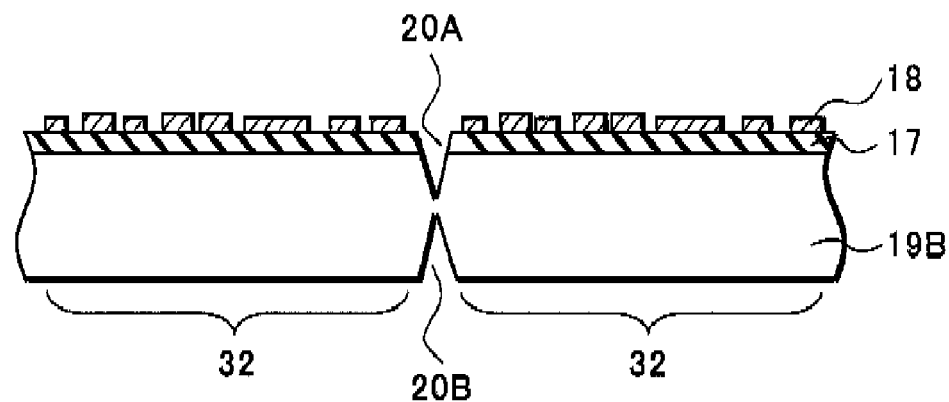

Next, the shape of the metal board 19B after forming the grooves 20 will be described with reference to FIG. 4A and FIG. 4B. FIG. 4A is a perspective view of the metal board 19B on which the grooves are formed by use of the V cutting saw 35, and FIG. 4B is a cross-sectional view of the metal board 19B.

As shown in FIG. 4A, the first grooves 20A and the second grooves 20B are formed in the lattice shapes on the front surface and the back surface of the metal board 19B. Here, the positions of the first grooves 20A and the second grooves 20B correspond to one another in a two-dimensional manner. In this embodiment, since the grooves are formed by use of the V cutting saw 35 having the V-shaped blades 35A, the grooves 20 have cross sections in V shapes. Meanwhile, centerlines of the grooves 20 correspond to the boundaries of the respective units 32 formed on the insulating layer 17. Here, the first grooves 20A are formed on the surface where the insulating layer 17 is formed, and the second grooves 20B are formed on the opposite surface.

The shape and other features of the grooves 20 will be described with reference to FIG. 4B. Here, the grooves 20 are formed into the cross sections of substantially V shapes. Moreover, the depths of the first grooves 20A and the second grooves 20B are shallower than a half of the thickness of the metal board 19B. Therefore, the respective units 32 are not divided into the respective circuit boards 16 in this process. That is, the respective units 32 are connected to one another by the remaining thickness of the metal board 19B corresponding to the portions provided with the grooves 20. Accordingly, it is possible to treat the metal board 19B as a single sheet until the metal board 19B is divided into the respective circuit boards 16. Moreover, if the "burr" is generated in this process, the "burr" is removed by performing high pressure cleaning.

Here, the widths and the depths of the first and second grooves 20A and 20B are adjustable. To be more precise, it is possible to increase an effective area capable of forming the conductive patterns 18 by means of reducing aperture angles of the first grooves 20A. Meanwhile, a similar effect is also achieved by reducing the depths of the first grooves 20A. It is also possible to form the first grooves 20A and the second grooves 20B in the same size. In this way, it is possible to suppress occurrence of warpage of the metal board 19B on which the grooves 20 are formed in the lattice shapes.

Figure 5A:
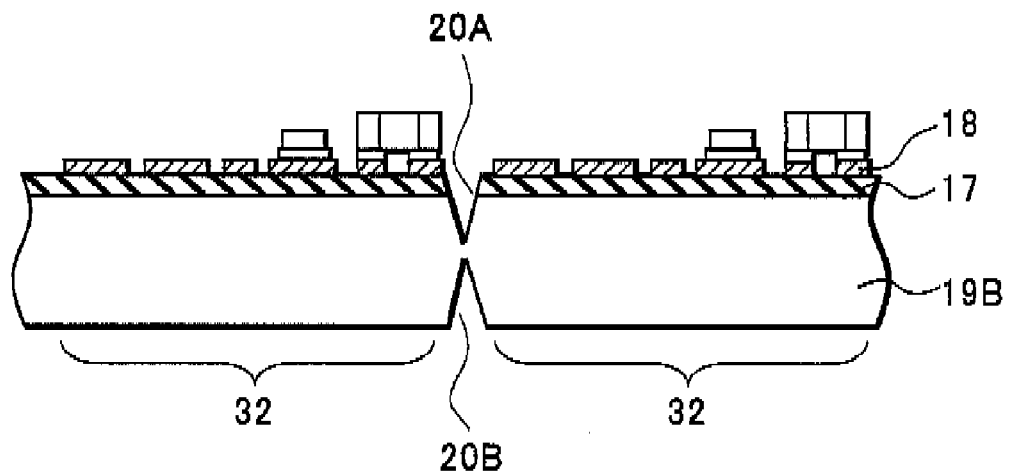
FIG. 5A is another cross-sectional view and FIG. 5B is still another cross-sectional view showing the method of manufacturing a hybrid integrated circuit device of the preferred embodiment.
Figure 5B:
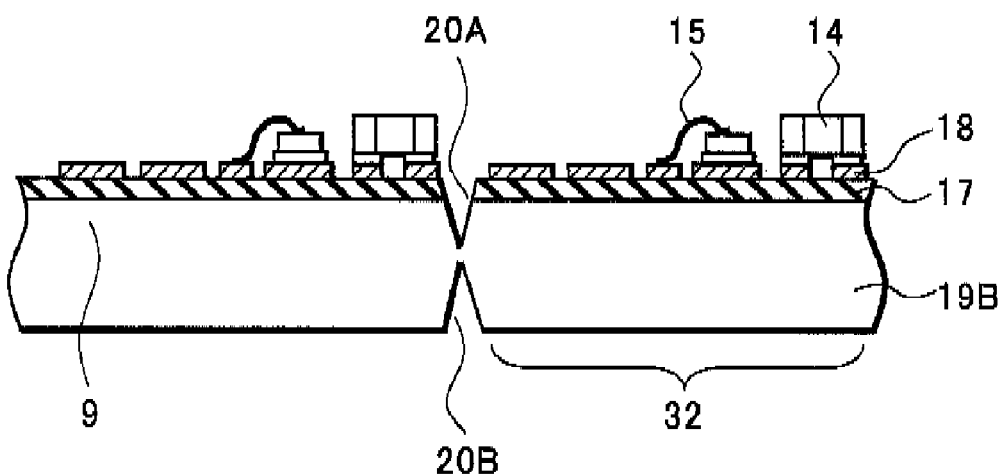
Figure 6:
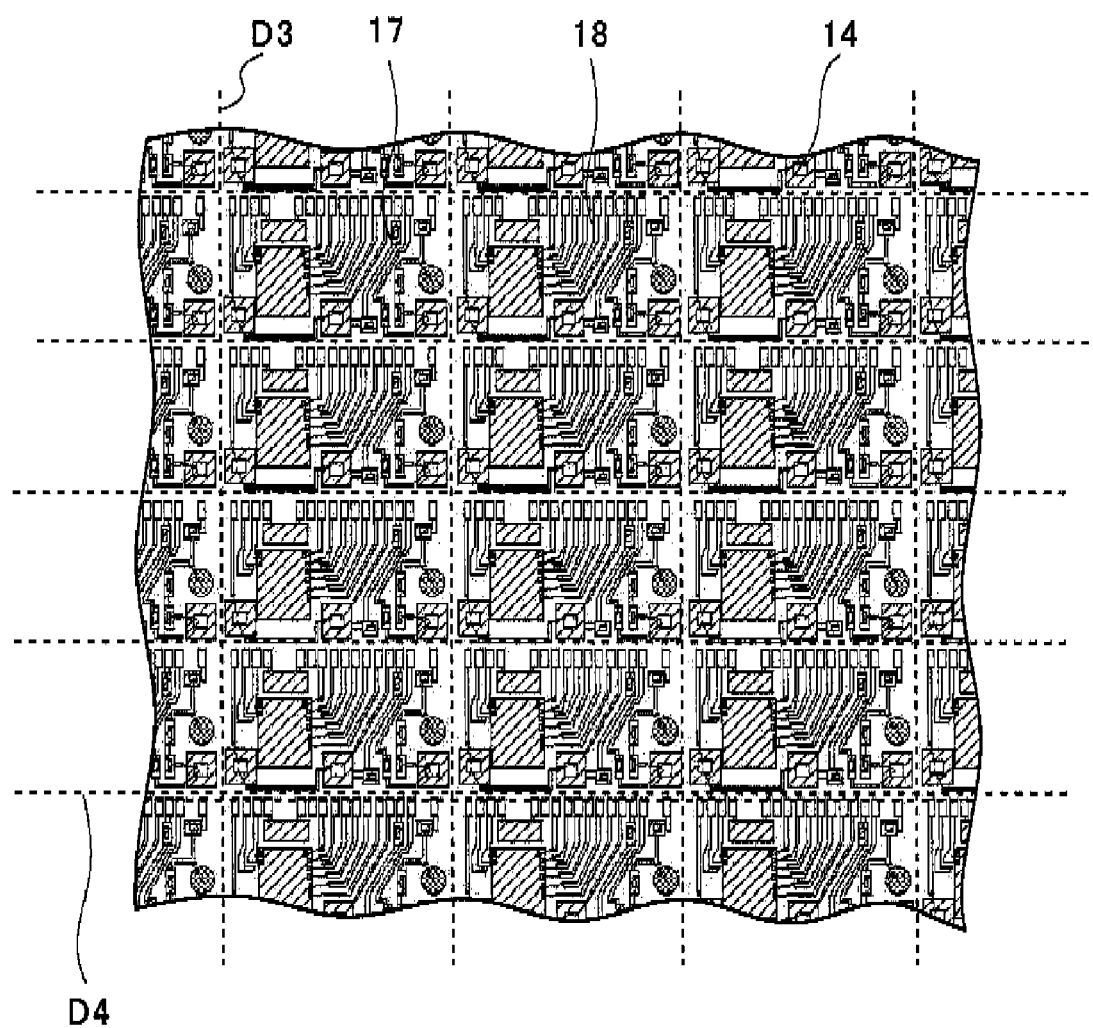
FIG. 6 is another plan view showing the method of manufacturing a hybrid integrated circuit device of the preferred embodiment.

Third Process: see FIG. 5A to FIG. 6

This is a process for mounting the circuit elements 14 on the conductive patterns 18 and electrically connecting the circuit elements 14 to the conductive patterns 18.

Firstly, as shown in FIG. 5A, the circuit elements 14 are mounted in given positions on the conductive patterns 18 by use of a brazing material such as solder.

Next, as shown in FIG. 5B, the circuit elements 14 are electrically connected to the conductive patterns 18. Here, the respective units 32 in the number of several tens to several hundreds of pieces formed on the single metal board 19B are subjected to wire bonding in a lump.

The hybrid integrated circuits in the respective units 32 formed on the metal board 19B will be described with reference to FIG. 6. FIG. 6 is a plan view of a part of hybrid integrated circuits 17 formed on the metal board 19B. In a real case, more numerous units of the hybrid integrated circuits 17 are formed thereon. Moreover, dicing lines D3 for dividing the metal board 19B into the respective circuit boards 16 are indicated by dashed lines in the drawing. As it is apparent from the drawing, the conductive patterns 18 constituting the respective hybrid integrated circuits are located very close to the dicing lines D3. From this point, it is apparent that the conductive patterns 18 are formed thoroughly on the surface of the metal board 19B.

In the foregoing explanation, the hybrid integrated circuits are formed all at once on the surface of the board 19B having the rectangular shape. Here, when there is a restriction in a manufacturing machine for performing die bonding or wire bonding, it is also possible to divide the metal board 19B into desired shaped prior to this process.

Fourth Process: see FIG. 7A to FIG. 9B

This is a process for separating the circuit boards 16, which are the respective units, by dividing the metal board 19B into pieces at the positions of the grooves 20. There are various methods of separating the units from each other. Here, a separating method by bending and a separating method by use of a cutter will be described.

Figure 7A:
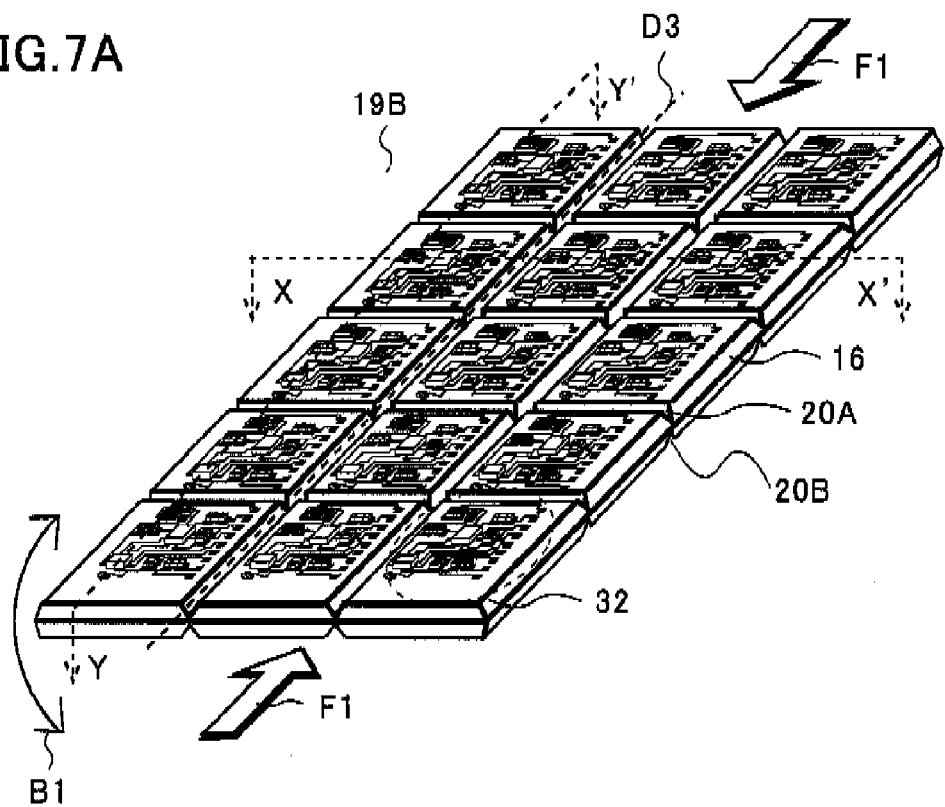
FIG. 7A is another perspective view.
Figure 7B:
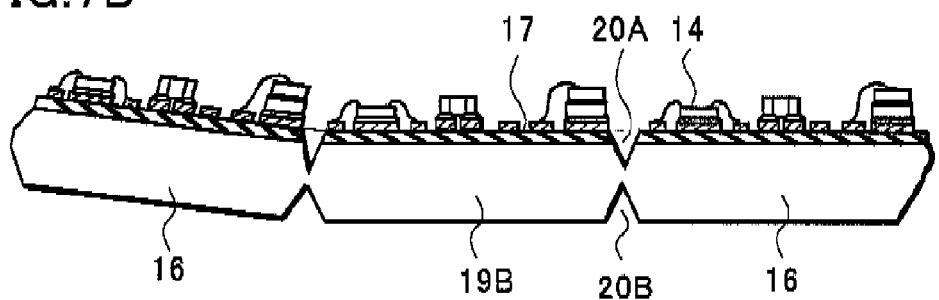
FIG. 7B is another cross-sectional view.
Figure 7C:
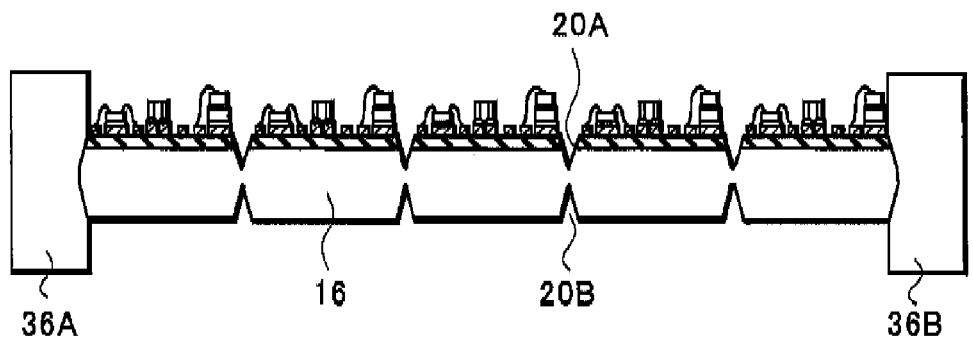
FIG. 7C is still another cross-sectional view showing the method of manufacturing a hybrid integrated circuit device of the preferred embodiment.

The method of dividing the metal board 19B into the respective circuit boards 16 by bending the metal board 19B will be described with reference to FIGS. 7A to 7C. FIG. 7A is a perspective view of the metal board 19B before separation, FIG. 7B is a cross-sectional view taken along the X-X' line in FIG. 7A, and FIG. 7C is a cross-sectional view taken along the Y-Y' line in FIG. 7A. In this method, the metal board 19B is partially at the positions where the first grooves 20A and the second grooves 20B are formed. The portions at positions where the first grooves 20A and the second grooves 20B are formed are retained connected only with thickness left out after providing the grooves 20. Therefore, it is possible to break such junctions easily by bending the metal board 19B in these positions. When the metal board 19B is the board made of aluminum, the metal board 19B should be bent several times until the circuit boards 16 are separated because aluminum is viscous metal.

As shown in FIG. 7A, in this process, the metal board 19B is divided firstly along division lines D3 and then divided along division lines D4. In other words, by dividing the metal board 19B including the plurality of units 32 arranged in a matrix are divided along one direction to obtain a metal board strip 19C in which the plurality of circuit boards 16 are connected in one direction. Thereafter, the metal board strip 19C is divided along another direction to obtain the respective circuit boards 16. Here, the metal board 19B is divided into three metal board strips 19C by performing the division completely in the direction of the dividing lines D3. In reality, more numerous circuit boards 16 are formed therein. The bending of the metal board 19B is performed while fixing the metal board 19B in a fixing direction F1 as illustrated in the drawing.

The cross section along the X-X' line in the state of division along the dividing lines D3 will be described with reference to FIG. 7B. Here, the metal board 19B is being bent at a boundary between the circuit board 16 located at the left and the circuit board 16 adjacent thereto. Such bending is performed continuously along a bending direction B1 which is illustrated in FIG. 7A. Aluminum used as the material for the metal board 19B is a viscous material. Accordingly, the metal board 19B is divided by bending for several times.

As shown in FIG. 7C, the metal board 19B is bent after fixing the side surfaces of the metal board 19B to fixing parts 36. In this process, side surfaces of the circuit boards 16 are inclined into a convex shape. Accordingly, it is possible to fix the metal board 19B by pressing the convex side surfaces from a lateral direction. Therefore, the fixing part 36A does not contact with the surface of the metal board 19B. In this way, it is possible to form the conductive patterns and the circuit elements 14 on the entire surface of the metal board 19B.

Figure 8A:
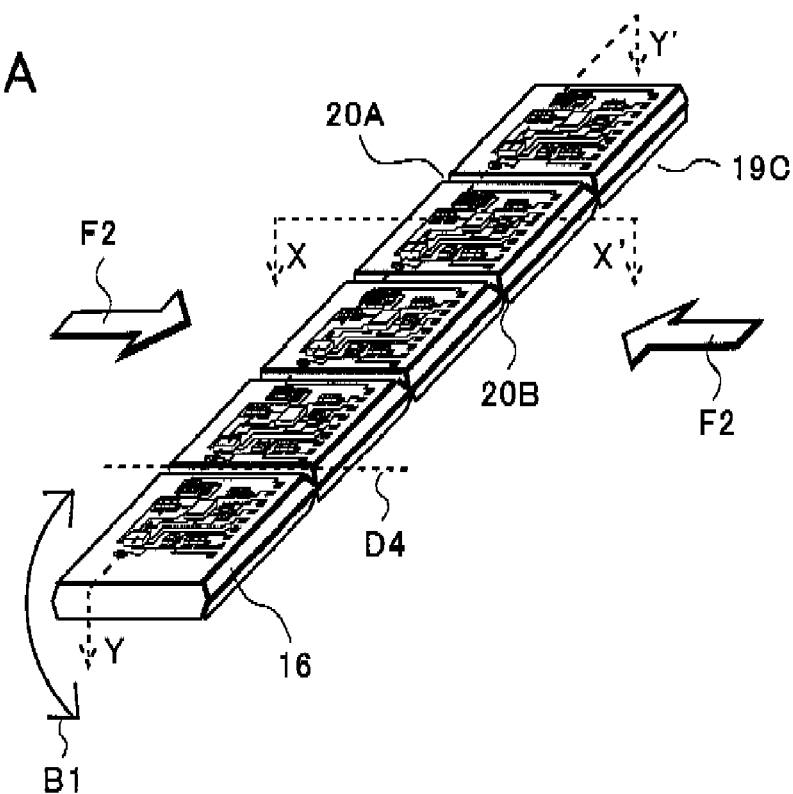
FIG. 8A is another perspective view.
Figure 8B:
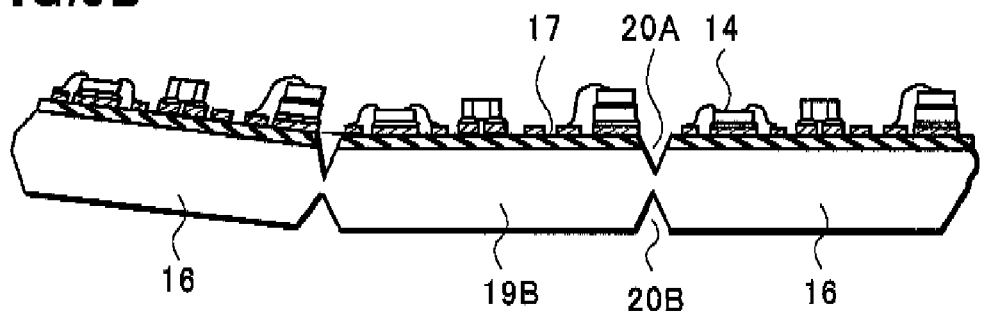
FIG. 8B is another cross-sectional view.
Figure 8C:
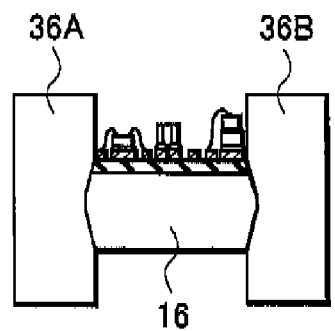
FIG. 8C is still another cross-sectional view showing the method of manufacturing a hybrid integrated circuit device of the preferred embodiment.

Next, as shown in FIGS. 8A to 8C, the respective units 32 are separated by dividing the metal board strip 19C. FIG. 8A is a perspective view of the metal board strip 19C, FIG. 8B is a cross-sectional view taken along the Y-Y' line in FIG. 8A, and FIG. 8C is a cross-sectional view taken along the X-X' line in FIG. 8A.

As shown in FIG. 8A and FIG. 8B, the circuit board 16 located at the terminal end is separated from the metal board strip 19C by bending along the dividing line D4. The bending principle herein is similar to the method described with reference to FIGS. 7A to 7C, but is only different in terms of the direction of separation. Here, the metal board strip 19C is divided while fixing the side surfaces of the metal board strip 19C in a fixing direction F2.

As shown in FIG. 8C, the circuit boards 16 are separated while fixing the side surfaces thereof by use of the fixing parts 36. Here, the fixing parts 36 do not contact with the surface of the circuit boards 16. Accordingly, there is an advantage that it is possible to form the electric circuit on the entire surface of the circuit board 16.

Figure 9A:
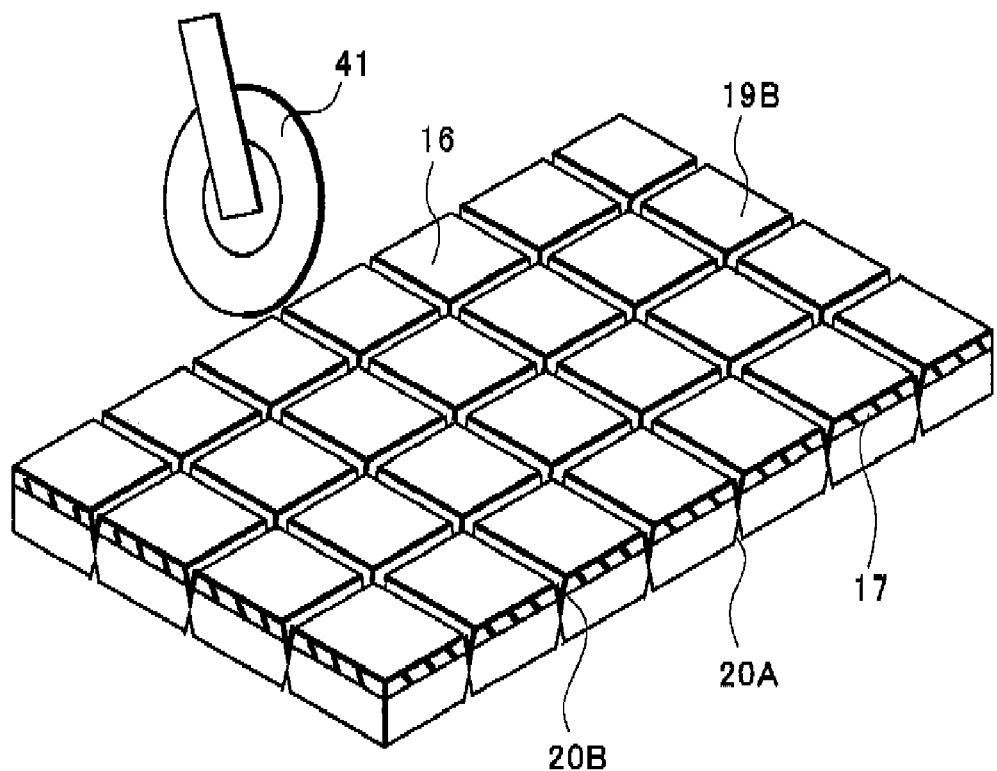
FIG. 9A is another perspective view and FIG. 9B is another cross-sectional view showing the method of manufacturing a hybrid integrated circuit device of the preferred embodiment.
Figure 9B:
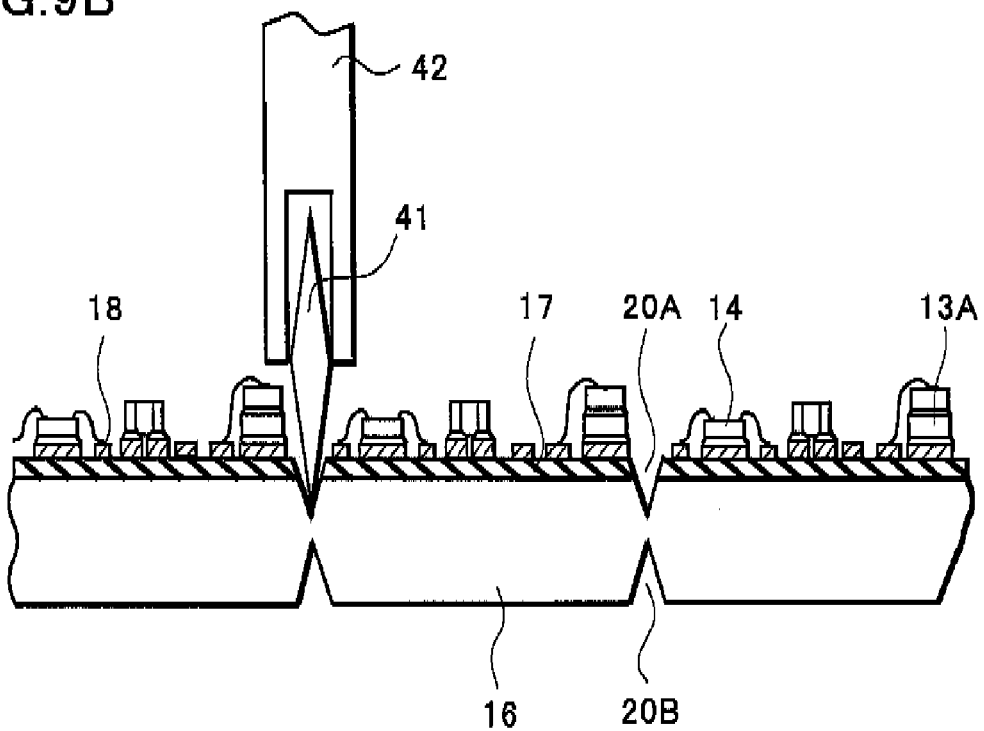

Now, the method of dividing the metal board 19B by use of a round cutter 41 will be described with reference to FIGS. 9A and 9B. As shown in FIG. 9A, the metal board 19B is cut out by pushing along dicing lines with the round cutter 41. In this way, the metal board 19B is divided into the respective circuit boards 16. The round cutter 41 cuts the remaining thickness of the metal board 19B without formation of the grooves 20, which correspond to the centerlines of the grooves 20.

Details of the round cutter 41 will be described with reference to FIG. 9B. The round cutter 41 has a discoid shape and the periphery thereof is formed into a sharp edge. The center of the round cutter 41 is fixed to a support 42 so that the round cutter 41 can rotate freely. The round cutter 41 does not have driving force. That is, the round cutter 41 is rotated by moving the round cutter 41 along the dicing lines while pressing part of the round cutter 41 against the metal board 19B.

In addition to the method described above, it is also possible to consider a method of separating the respective circuit boards by removing the remaining thickness of the board in the positions provided with the first and second grooves 20A and 20B by use of a laser. Moreover, it is possible to remove the remaining thickness of the board by use of a cutting saw which rotates at high speed. Furthermore, it is also possible to separate the respective circuit boards by stamping.

Figure 10A:
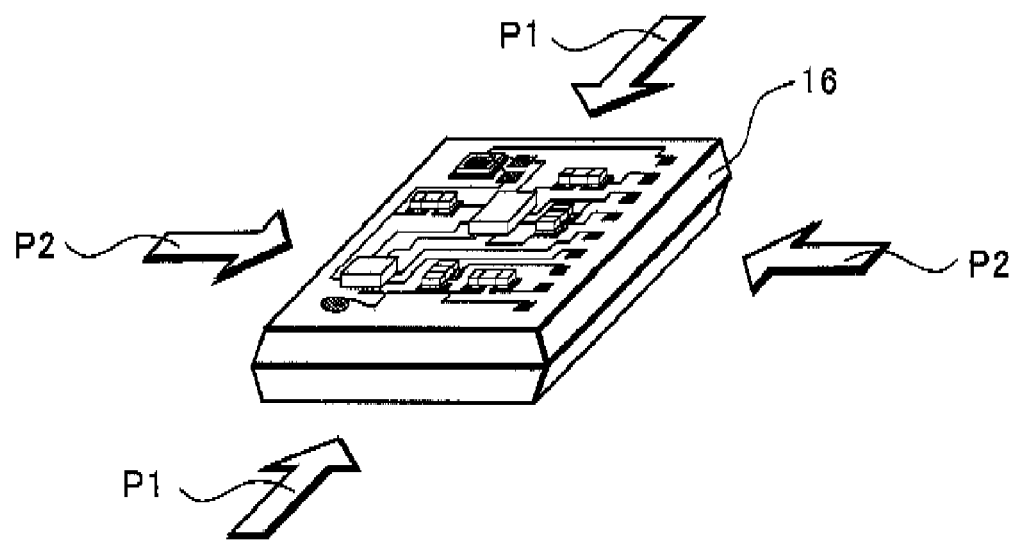
FIG. 10A is another perspective view and FIG. 10B is another cross-sectional view showing the method of manufacturing a hybrid integrated circuit device of the preferred embodiment.
Figure 10B:
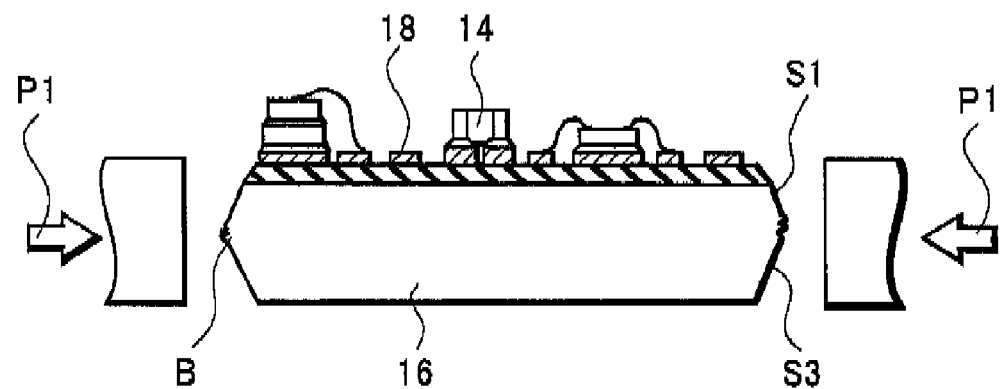

Fifth Process: see FIGS. 10A to 10B

In this process, the side surfaces of the circuit boards 16 respectively divided in the precedent process are pressed. FIG. 10A is a perspective view showing this process, and FIG. 10B is a cross sectional view thereof.

As shown in FIG. 10A and FIG. 10B, the side surfaces of the circuit board 16, which face one another, are firstly pressed against each other along pressing directions P1. Then, after completing the press along the pressing directions P1, a press along pressing directions P2 is performed. Some burr B is formed on each of the side surface of the circuit board 16 separated by the separating method applying a bending or a cutting step. Now, if subsequent processes are performed while leaving this burr on the side surface of the circuit board 16, the problem will occur as in the conventional example. In this process, to solve the problem attributable to the burr, pressure is applied to the side surfaces of the circuit board 16. Aluminum used as the material for the circuit board 16 is softer than other metal. Accordingly, when the pressure is applied to the side surface of the circuit board 16, the burr is integrated with the side surface of the circuit board 16. Moreover, it is possible to regulate the outside dimensions of the circuit board 16 to a predetermined size by applying the pressure until achieving the predetermined dimensions. Accordingly, this process has an advantage that it is possible to equalize the size of the circuit boards 16 and to integrate the burr with the side surface of the circuit board 16 at the same time.

By forming the outer dimensions of the circuit board 16 into the predetermined size, it is possible to perform alignment in various processes by use of the contour of the circuit board 16. That is, it is possible to align the circuit board 16 accurately by use of the contour thereof in various steps, such as a molding step, a step of fixing leads, a step of processing the leads or a step of measuring characteristics of the entire device, without providing independent position detecting means. It is to be noted that the above-described separating methods are also applicable to boards made of metal other than aluminum. To be more precise, the above-described separating methods are applicable to a board made of metal other than aluminum, a board made of resin, a flexible sheet, and the like.

Process 6: See FIG. 11

Figure 11:
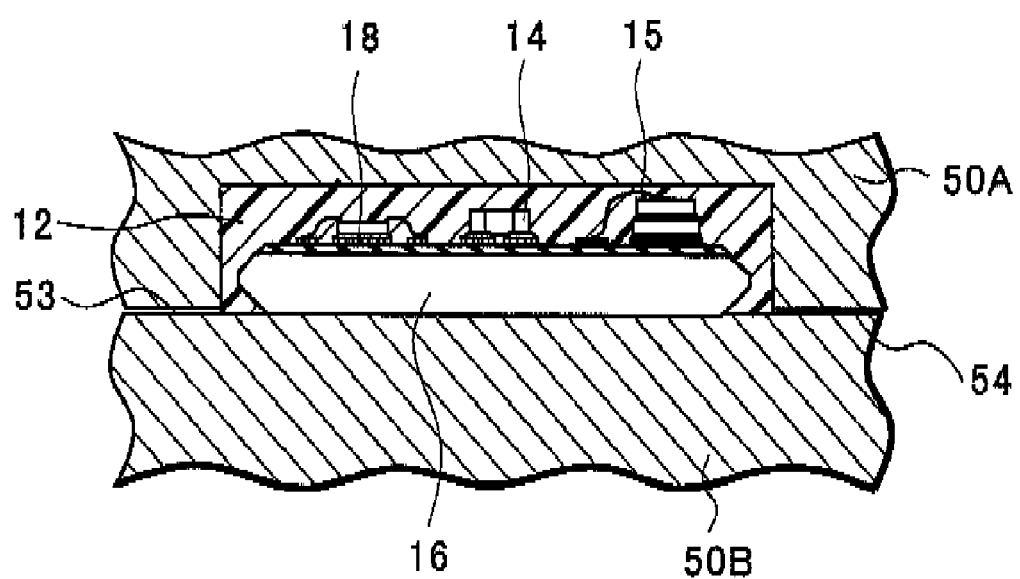
FIG. 11 is another cross-sectional view showing the method of manufacturing a hybrid integrated circuit device of the preferred embodiment.
Figure 12A:
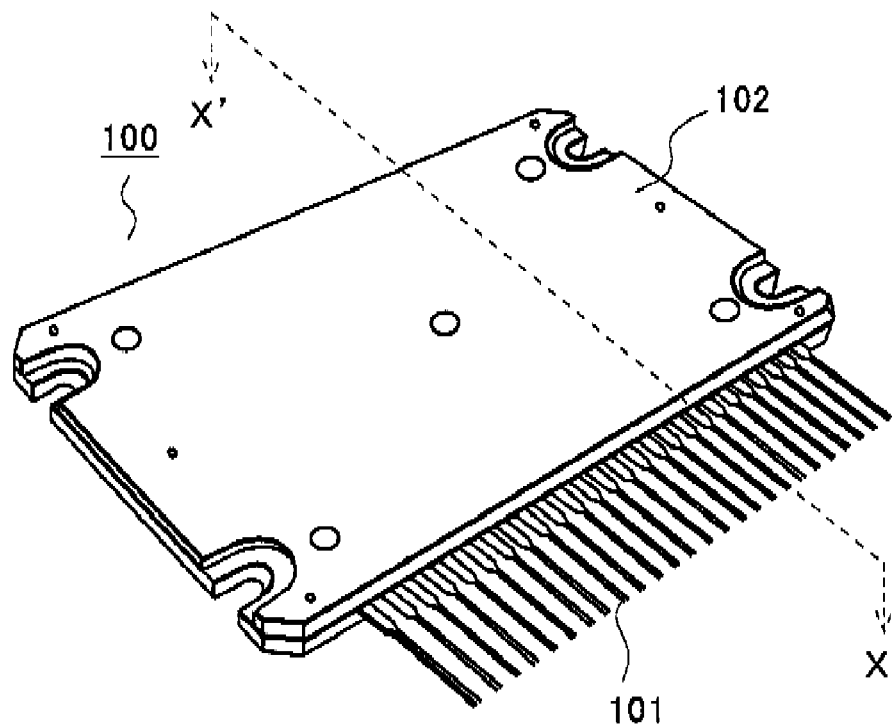
FIG. 12A is a plan view and FIG. 12B is a cross-sectional view showing a conventional hybrid integrated circuit device.
Figure 12B:
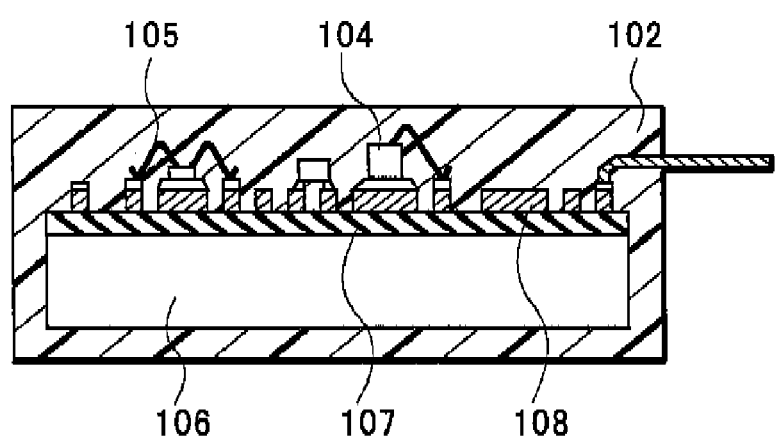
Figure 13A:
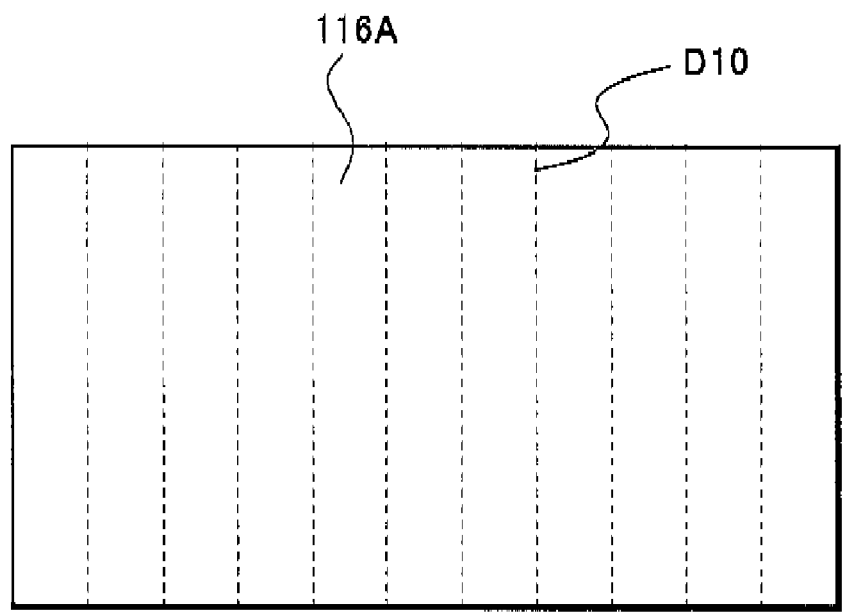
FIG. 13A is a plan view and FIG. 13B is a cross-sectional view showing a method of manufacturing a conventional hybrid integrated circuit device.
Figure 13B:
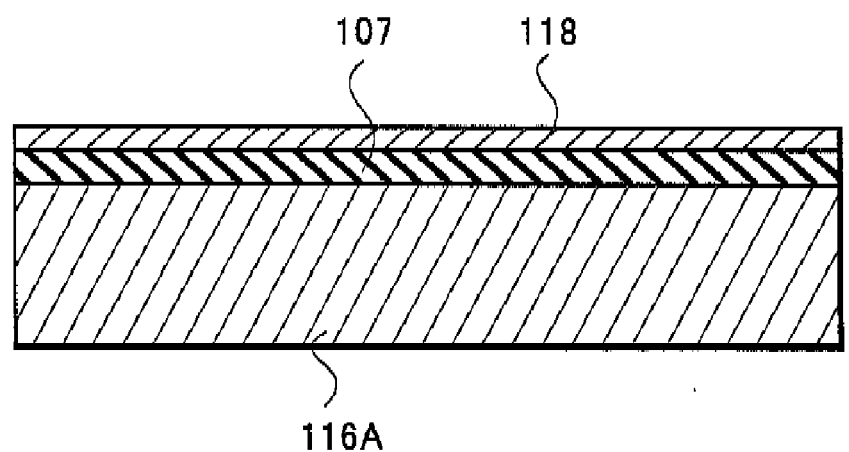
Figure 14A:
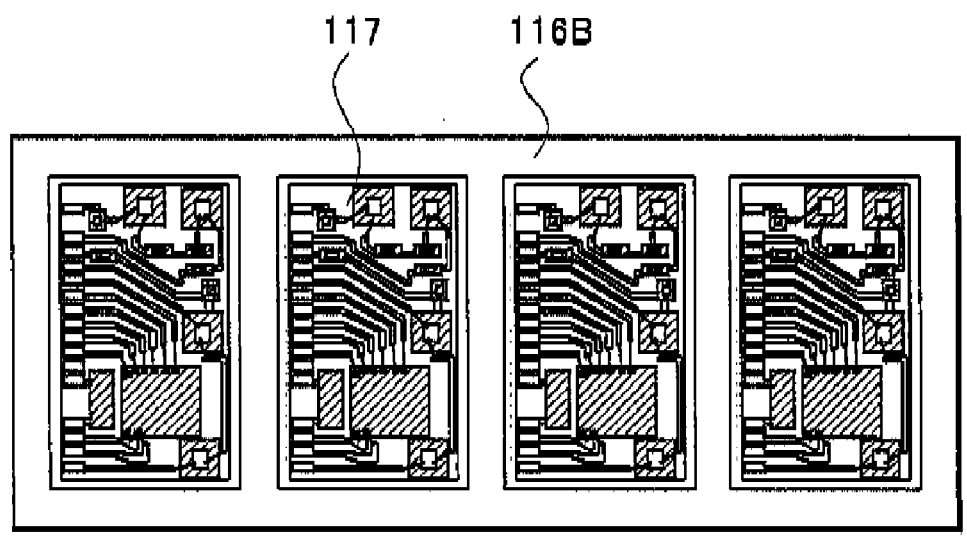
FIG. 14A is another plan view and FIG. 14B is another cross-sectional view showing the method of manufacturing a conventional hybrid integrated circuit device.
Figure 14B:
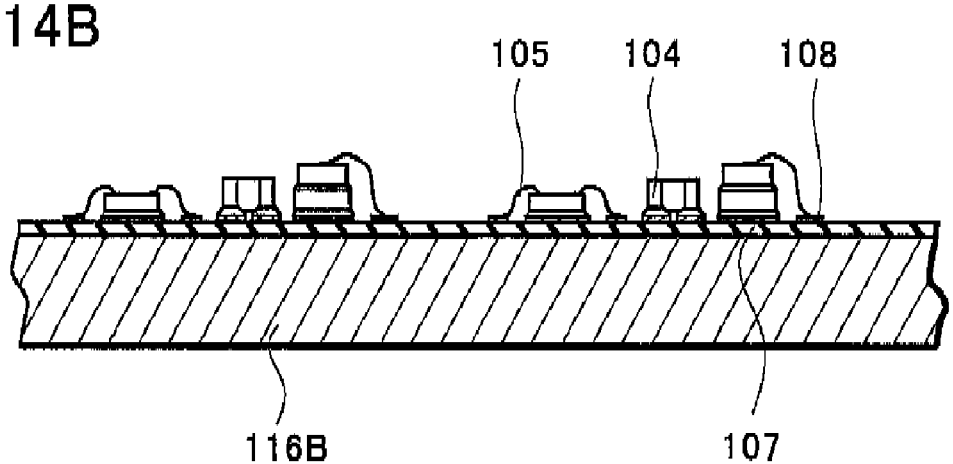
Figure 15:
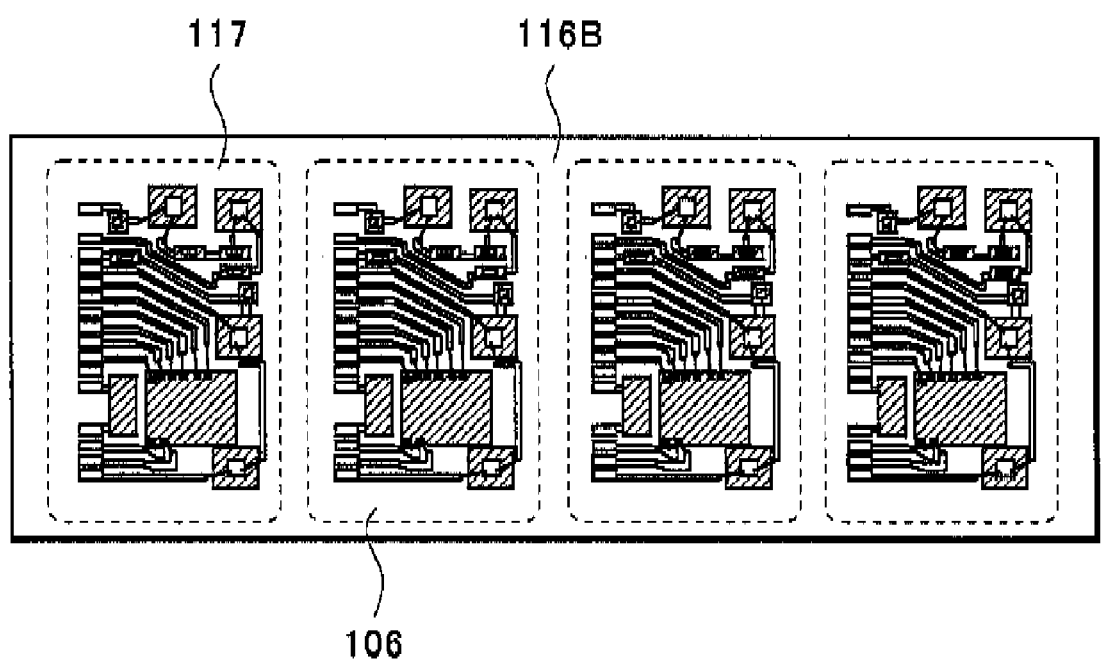
FIG. 15 is another plan view showing the method of manufacturing a conventional hybrid integrated circuit device.

A process for sealing the circuit board 16 with the sealing resin 12 will be described with reference to FIG. 11. FIG. 11 is a cross-sectional view showing the process of sealing the circuit board 16 with the sealing resin 12 by use of molds 50.

Firstly, the circuit board 16 is placed on a lower mold 50B. Next, the sealing resin 12 is injected through a gate 53. As the method of sealing, it is possible to adopt either the transfer molding using thermosetting resin or the injection molding using thermoplastic resin. Then, the gas inside a cavity corresponding to the amount of the sealing resin 12 injected through the gate 53 is discharged to outside through an air vent 54.

As described above, the inclined portions are provided on the side surfaces of the circuit board 16. Accordingly, the sealing resin 12 permeates the inclined portions in the course of sealing with the insulative resin. In this way, an anchor effect is generated between the sealing resin 12 and the inclined portions, and bonding between the sealing resin 12 and the circuit board 16 is thereby strengthened. The circuit board 16 sealed by the resin is finished as a product after a lead cutting process and the like.

What is claimed is:

1. A method of manufacturing a hybrid integrated circuit device comprising:
    forming a plurality of units each including a conductive pattern on a front surface of a board;
    electrically connecting circuit elements to the conductive patterns in the respective units;
    separating respective circuit boards by dividing the board along boundaries of the units; and
    flattening side surfaces of the circuit boards by pressing the side surfaces.

2. A method of manufacturing a hybrid integrated circuit device comprising:
    forming a plurality of units each including a conductive pattern on a surface of a board made of metal;
    forming grooves along boundaries of the respective units of the board;
    electrically connecting circuit elements to the conductive patterns in the respective units;
    separating respective circuit boards by dividing the board along the grooves; and
    flattening side surfaces of the circuit boards by pressing the side surfaces.

3. The method of manufacturing a hybrid integrated circuit device according to claim 2,
  wherein the grooves include:
   a first groove formed on the front surface of the board; and
   a second groove formed on a back surface of the board.

4. The method of manufacturing a hybrid integrated circuit device according to claim 2,
  wherein the board is separated by bending the board at a position of each of the grooves.

5. The method of manufacturing a hybrid integrated circuit device according to claim 4,
  wherein the board is bent while supporting the board from both side surfaces of the board.

6. The method of manufacturing a hybrid integrated circuit device according to any one of claims 1 and 2,
  wherein the plurality of units are formed in a matrix form.

* * * * *